(12) United States Patent
Kaviladath et al.

(10) Patent No.: US 10,396,814 B2
(45) Date of Patent: *Aug. 27, 2019

(54) REFERENCE VOLTAGE CONTROL CIRCUIT FOR A TWO-STEP FLASH ANALOG-TO-DIGITAL CONVERTER

(71) Applicant: TEXAS INSTRUMENTS INCORPORATED, Dallas, TX (US)

(72) Inventors: Jafar Sadique Kaviladath, Kozhikode (IN); Neeraj Shrivastava, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/211,259

(22) Filed: Dec. 6, 2018

(65) Prior Publication Data

US 2019/0207619 A1 Jul. 4, 2019

Related U.S. Application Data

(63) Continuation of application No. 15/883,623, filed on Jan. 30, 2018, now Pat. No. 10,181,861.

(60) Provisional application No. 62/612,019, filed on Dec. 29, 2017.

(51) Int. Cl.
*H03M 1/36* (2006.01)
*H03K 19/0175* (2006.01)

(52) U.S. Cl.
CPC .... *H03M 1/361* (2013.01); *H03K 19/017509* (2013.01)

(58) Field of Classification Search
CPC ........ H03M 1/361; H03M 1/365; H03M 1/12; H03K 19/017509
USPC .................................. 341/155, 159; 327/451
See application file for complete search history.

(56) References Cited

U.S. PATENT DOCUMENTS

| | | | |
|---|---|---|---|
| 5,867,116 A | 2/1999 | Nakamura et al. | |
| 6,624,779 B2 | 9/2003 | Hochschild | |
| 6,803,871 B2 * | 10/2004 | Mallinson | H03M 1/367 341/155 |
| 7,830,294 B2 | 11/2010 | Feldotte et al. | |
| 7,839,320 B2 | 11/2010 | Feldotte et al. | |
| 8,547,114 B2 | 10/2013 | Kremin | |
| 2011/0199010 A1 | 8/2011 | Cho et al. | |
| 2013/0278447 A1 | 10/2013 | Kremin | |

* cited by examiner

*Primary Examiner* — Jean B Jeanglaude
(74) *Attorney, Agent, or Firm* — John R. Pessetto; Charles A. Brill; Frank D. Cimino

(57) ABSTRACT

A circuit, which is usable in a flash analog-to-digital converter, includes a first switch configured to provide a first reference voltage to a first reference node responsive to a first control signal and a second switch configured to provide the first reference voltage to a second reference node responsive to a second control signal. A third switch is coupled to the first switch and is configured to provide a second reference voltage to the first reference node responsive to a clock signal. Further, a fourth switch is coupled to the second switch and configured to provide the second reference voltage to the second reference node responsive to the clock signal.

8 Claims, 3 Drawing Sheets

US 10,396,814 B2

REFERENCE VOLTAGE CONTROL CIRCUIT FOR A TWO-STEP FLASH ANALOG-TO-DIGITAL CONVERTER

CROSS-REFERENCE TO RELATED APPLICATIONS

This continuation application claims priority to U.S. patent application Ser. No. 15/883,623, filed Jan. 30, 2018, which claims priority to Provisional Patent Application No. 62/612,019, filed Dec. 29, 2017, both of which are hereby incorporated herein by reference in their entirety.

BACKGROUND

An analog-to-digital converter (ADC) converts an analog signal to a digital signal. The analog input range of the ADC is divided into a $2^n$ discrete steps, where "n" is the number of bits of the output digital signal from the ADC. For example, if n is 5 (for a 5-bit ADC), then the converter discretizes the analog input signal into $2^5$ or 32 discrete steps.

One type of ADC is a flash converter which includes a separate comparator for each of the discretized elements of the input analog range. In the example above of a 5-bit flash converter which has 32 discrete steps, the converter would have 32 separate comparators. A separate reference voltage is generated and provided to each comparator to corn pare with the analog input range.

To save power and area, a two-step flash converter includes a zero crossing comparator to initially determine whether the analog input is positive or negative to thereby determine in which half of the analog input range that the analog input signal resides. Then, a flash converter is used to produce the digital output value. As the zero crossing comparator has already ruled out half of the analog input range for the particular analog input signal to be converted, the subsequent flash converter need not include 32 comparators, and instead only includes 16 comparators. The reference voltage provided to each of the comparators is configured by the flash converter to be a positive voltage or a negative voltage.

SUMMARY

In one example, a flash analog-to-digital converter (ADC) includes a zero crossing comparator, a flash converter, and a reference voltage control circuit. The zero crossing comparator is configured to compare an input analog voltage to a zero voltage. The flash converter comprises a plurality of comparators. Each of the plurality of comparators includes a comparator reference voltage. Further, each of the plurality of comparators is configured to compare the input analog voltage to its comparator reference voltage. The reference voltage control circuit is configured to, responsive to an output signal from the zero crossing comparator, selectively switch a first reference voltage and a second reference voltage to a first reference node and a second reference node of the flash converter. Further, the reference voltage control circuit is configured to switch the second reference voltage to the first reference node and to the second reference node after receipt by the flash converter of an edge of a clock to cause the flash converter to begin using voltages on the first and second reference nodes and the input analog voltage to generate a flash converter output. The comparator reference voltage for each comparator is generated based on voltages on the first and second reference nodes.

In yet another example, a circuit, which is usable in a flash analog-to-digital converter, includes a first switch configured to provide a first reference voltage to a first reference node responsive to a first control signal and a second switch configured to provide the first reference voltage to a second reference node responsive to a second control signal. A third switch is coupled to the first switch and is configured to provide a second reference voltage to the first reference node responsive to a clock signal. Further, a fourth switch is coupled to the second switch and configured to provide the second reference voltage to the second reference node responsive to the clock signal.

In yet another embodiment, a circuit includes a first switch configured to provide a first reference voltage to a first reference node responsive to a first control signal, and a second switch configured to provide the first reference voltage to a second reference node responsive to a second control signal. The circuit also includes a third switch coupled to the first switch and configured to provide a second reference voltage to the first reference node responsive to a clock signal, and a fourth switch coupled to the second switch and configured to provide the second reference voltage to the second reference node responsive to the clock signal. The second reference voltage is smaller than the first reference voltage, and the first and second control signals are of opposite polarity.

BRIEF DESCRIPTION OF THE DRAWINGS

For a detailed description of various examples, reference will now be made to the accompanying drawings in which.

DETAILED DESCRIPTION

A two-step flash converter may be characterized by several problems. One problem is that switches that switch reference voltages to the flash converter and which are controlled by the output of the zero crossing comparator need sufficient time to settle before the reference voltages can be used by the flash converter. The settling time is limits the bandwidth of the converter. The bandwidth is also limited by the use of level shifters that may be included to operate one or more of the switches because such level shifters introduce additional delay.

Another problem with a two-step flash converter pertains to cycle-dependent settling error. Settling error is the error between the reference voltage actually provided to the flash converter through the switches and the ideal value of the reference voltage. Due to parasitic capacitance in the circuit, upon opening and closing the switches by the output of zero crossing comparator, the voltage on the reference input node to the flash converter changes at a rate that is a function of the parasitic capacitance. Thus, when the flash converter is clocked to begin generating its decision, the voltage on the reference input node to the flash converter may not have fully settled to its final (ideal) value. Further, the magnitude of the settling error is not necessarily constant due to the analog input voltage. For example, for a number of consecutive samples in which the analog input voltage is positive will result in different settling errors compared to analog input voltage that changes between positive and negative for each of the consecutive samples. The disclosed embodiments are directed to a two-step flash converter which includes a circuit that addresses one or more of the aforementioned problems.

Figure 1:
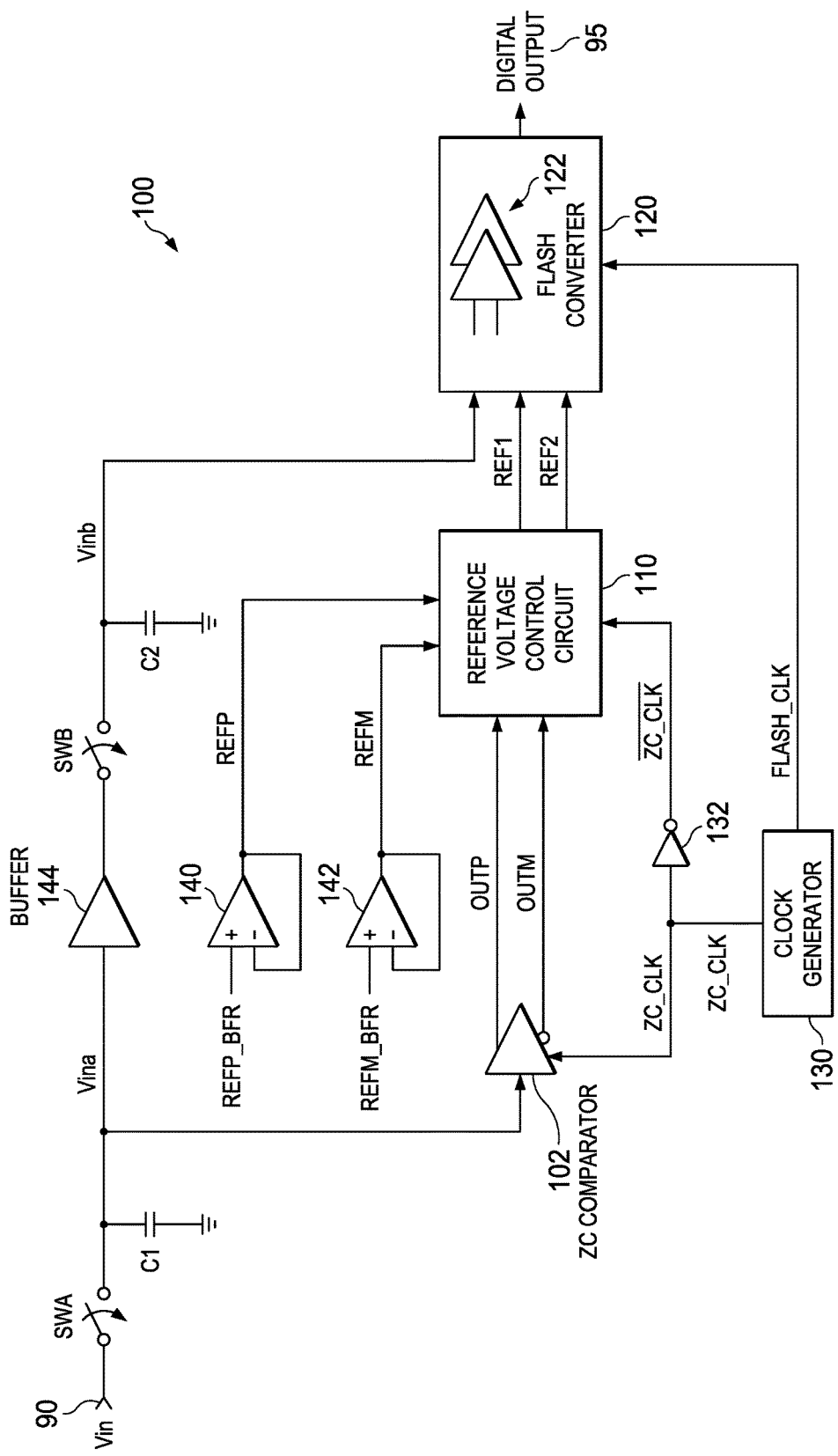
FIG. 1 illustrates a flash analog-to-digital converter including a reference voltage control circuit in accordance with an example.

FIG. 1 shows an example of a flash ADC 100 in accordance with various embodiments. In the example of FIG. 1, the flash ADC 100 includes a zero crossing (ZC) comparator 102, a reference voltage control circuit 110, a flash converter 120, a clock generator 130, an inverter 132, buffers 140, 142, and 144, and switches SWA and SWB. An input analog voltage 90, Vin, is converted to a digital output 95 by the flash ADC 100. The input analog voltage 90 can be any analog voltage within a range specified for the flash ADC 100. In some embodiments, the input range is from a specific negative voltage to a specific positive voltage (e.g., −2.5V to +2.5V). In other embodiments, the lower end of the range need not be a negative voltage and thus the range of Vin may be, for example, from 0V to 5V. In the embodiments described herein, the analog input voltage 90 is assumed to range from a negative voltage to a symmetric positive voltage (e.g., −1 v to +1 v, −2.5 v to +2.5 v, etc.) such that the midpoint of the input range is 0 v.

The flash ADC 100 in the example of FIG. 1 is a two-step flash ADC. In a first step, the input analog voltage 90 is sampled by capacitor C1 upon closure of SWA to produce a sampled analog input voltage Vina. The sampled analog input voltage Vina is then provided to ZC comparator 102. The ZC comparator 102 determines whether the sampled analog input voltage Vina is positive or negative. The ZC comparator 102 compares the sampled analog input voltage Vina to 0 v and generates an output signal that indicates whether the sampled analog input voltage Vina is greater or less than 0 v. In the example of FIG. 1, the output signal from the ZC comparator 102 comprises first and second comparator output signals, OUTP and OUTM. In some embodiments, OUTP and OUTM comprise differential signals of opposite polarity. In one embodiments, OUTP is larger than OUTM when the sampled analog input voltage is greater than 0 v (i.e., positive), while OUTP is smaller than OUTM when the sampled analog input voltage is smaller than 0 v (i.e., negative). In the embodiments described herein OUTP and OUTM encode the state of Vina (as to whether Vina is positive or negative) when ZC_CLK is a logic high. When ZC_CLK is a logic low, the ZC comparator 102 forces both OUTP and OUTM to logic high values.

The OUTP and OUTM output signals from the ZC comparator 102 are provided to the reference voltage control circuit 110. The reference voltage control circuit 110 also receives a first reference voltage, REFP, and a second reference voltage, REFM, from buffers 140 and 142, respectively. The input voltages to the buffers 140, 142 are REFP_BFR and REF_BFR, respectively. REFM is smaller than REFP in some embodiments. For example, the first reference voltage, REFP, is 1V and the second reference voltage, REFM, is 0.7 v in some embodiments, but the voltage levels of REFP and REFM can be different than 1 v and 0.7 v in other embodiments.

The reference voltage control circuit 110 switches the REFP and REFM reference voltages as REF1 and REF2 voltages to the flash converter 120. That is, as explained below, at some points during operation of the flash ADC 100 REFP is provided as REF1 to the flash converter 120, while REFM is provided as REF2 to the flash converter 120. At other points, REFM is provided as REF1 to the flash converter 120, while REFP is provided as REF2 to the flash converter 120.

Buffer 144 receives the sampled analog input voltage Vina. Capacitor C2 is used to again sample the sampled analog input voltage Vina as received from buffer 144 through switch SWB upon closure of SWB. The flash converter 120 comprises multiple comparators 122. The sampled analog input voltage Vinb from capacitor C2 is provided to the flash converter 120. Each comparator 122 compares Vinb to a reference voltage specific to that converter. In the case of, for example, a 5-bit flash ADC, there are 32 discrete digital outputs. The flash converter 120 for a 5-bit flash ADC comprises 16 comparators, not 32 comparators, and in general the reference voltages to the 16 comparators is set based on whether the analog input voltage 90 is positive or negative. One set of reference voltages is generated for the comparators 122 if Vin 90 is positive and a different set of reference voltages is generated for the comparators 122 if Vin 90 is negative. Based on the voltage levels of REF1 and REF2, the reference voltage input to each of the comparators 122 of the flash converter 120 is configured as a positive reference voltage or a negative reference voltage (e.g., +0.5 v or −0.5 v). Reference voltages for each of the comparators are generated from REF1 and REF2 either using width scaling of input transistors, a capacitive array, or a resistive ladder.

The clock generator 130 generates a ZC_CLK which is used to clock the ZC comparator 102. An inverter 132 inverters ZC_CLK to produce an inverted ZC_CLK ($\overline{ZC\_CLK}$), which is provided to the reference voltage control circuit 110.

Figure 2:
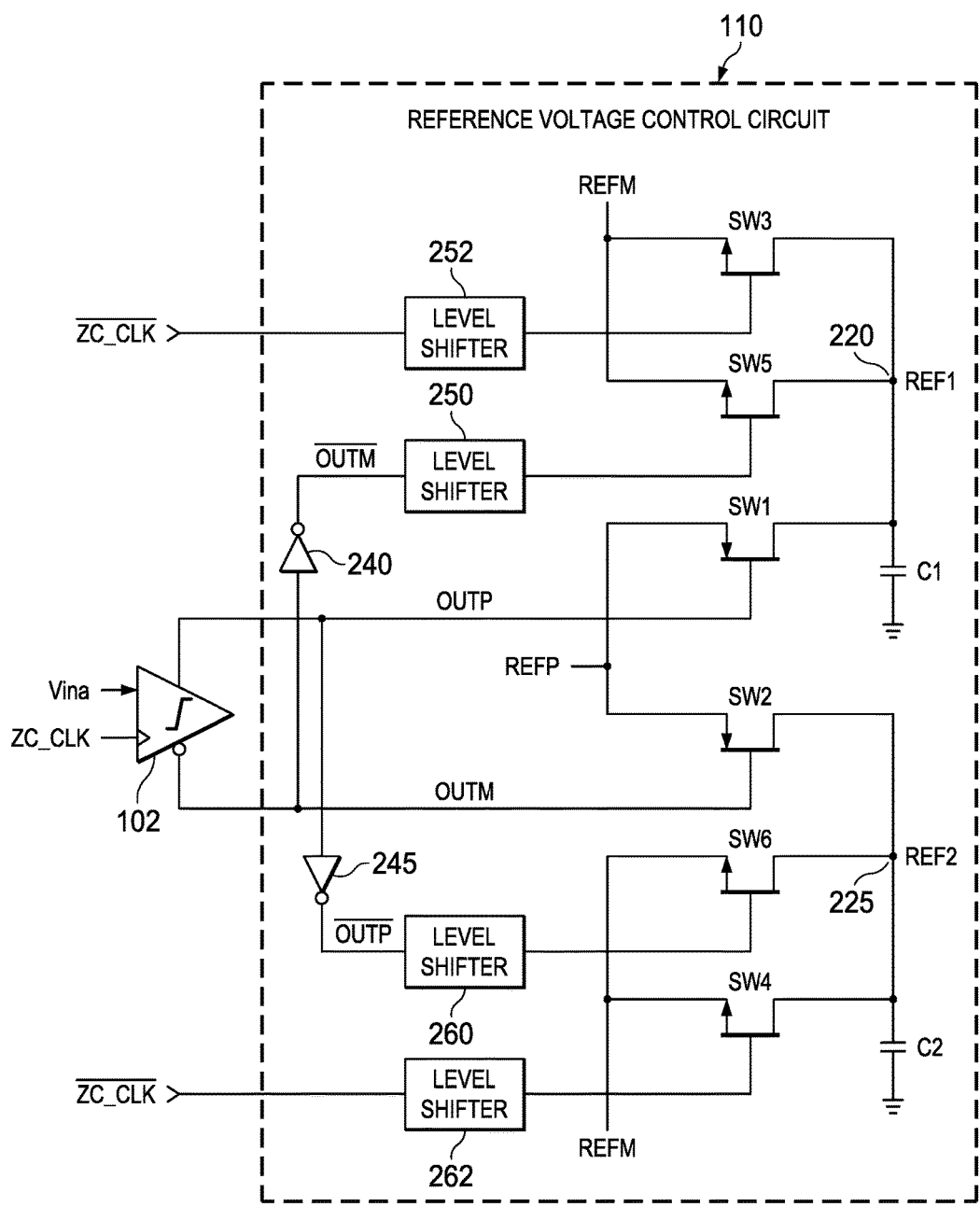
FIG. 2 illustrates an example of the reference voltage control circuit of FIG. 1 in accordance with an embodiment.

FIG. 2 shows the ZC comparator 102 coupled to an example of the reference voltage control circuit 110. The reference voltage control circuit 110 comprises switches SW1, SW2, SW3, SW4, SW5, and SW6, inverters 240 and 245, and level shifters 250, 252, 260, and 262. The switches SW1-SW6 comprise metal oxide semiconductor field effect transistors (MOSFETs) in the example of FIG. 2, but can comprise other types of transistor switches in other embodiments. In the example shown in FIG. 2, SW1 and SW2 comprise n-type MOSFETS (NMOS devices) and SW3-SW6 comprise p-type MOSFETS (PMOS devices), but each switch can be implemented as the opposite type of MOSFET in other embodiments.

The drains of SW1, SW3, and SW5 are coupled together to form a first reference node 220. Capacitor C1 is coupled between the first reference node 220 and ground. Similarly, the drains of SW2, SW4, and SW6 are coupled together to form a second reference node 225. Capacitor C2 is coupled between the second reference node 225 and ground. The voltage on the first reference node 220 is REF1 and the voltage on the second reference node 225 is REF2. REF1 and REF2 are provided to the flash converter 120 as noted above.

REFP from buffer 140 is provide to the sources of SW1 and SW2. REFM is provided to the sources of SW3 and SW5 as well as to the sources of SW4 and SW6. Through the switches SW1-SW6, either of REFP and REFM can be switched onto the first or second reference nodes 220 and 225. OUTP from the ZC comparator 102 is used to control the gate of SW1, and OUTM is used to control the gate of SW2. The gate of SW3 is controlled by $\overline{ZC\_CLK}$, which is provided to the gate of SW3 via level shifter 252. Similarly, the gate of SW4 is controlled by $\overline{ZC\_CLK}$, which is provided to the gate of SW3 via level shifter 262. OUTM is inverted by inverter 240 to generate $\overline{\text{OUTM}}$, which is provided to the gate of SW5 through level shifter 250 to control SW5. OUTP is inverted by inverter 245 to generate $\overline{\text{OUTP}}$, which is provided to the gate of SW6 through level shifter 260 to control SW6. The level shifters 252 and 262 are used to shift the voltage levels of $\overline{\text{ZC\_CLK}}$ to ensure that SW3 and SW4, which are PMOS devices in this example turn on given their source voltage REFM (which may be 0.7V in one embodiment). Similarly, level shifters 252 and 262 are used to shift the voltage levels of $\overline{\text{OUTM}}$ and $\overline{\text{OUTP}}$ to ensure that PMOS devices SW5 and SW6 turn on as well. In some implementations, each level shifter 250, 252, 260, and 262 shifts its input voltage up by approximately 0.5 v.

In some two-step flash ADCs, the output from the zero crossing comparator is used to control the state of switches that interconnect the reference voltages to the reference inputs of the comparators of the flash converter. It takes a finite amount of time for the zero crossing comparator to make its comparator decision (e.g., whether the analog input voltage is positive or negative). Upon asserting control signals to the gates of the switches interconnecting the reference voltages to the reference inputs of the flash converter's comparators, parasitic capacitance associated with the switches causes the reference voltages to the comparators to change a particular rate. A sufficient amount of settling time is permitted to elapse before the flash converter is clocked to begin its process of comparing the sampled analog input voltage to the reference voltages, and even then a settling error is present between the actual voltage level of the reference voltage and its ideal value. The settling time of the switches reduces the bandwidth capability of the flash ADC. The settling time problem is exacerbated by the time delay introduced by any level shifters included in the circuit. Further, the settling error can vary from cycle to cycle depending on the level of the analog input voltage. For example, an analog input voltage that remains positive (or negative) for multiple consecutive cycles will have a smaller settling error than if the analog input voltage switches between positive and negative for each consecutive cycle.

Figure 3:
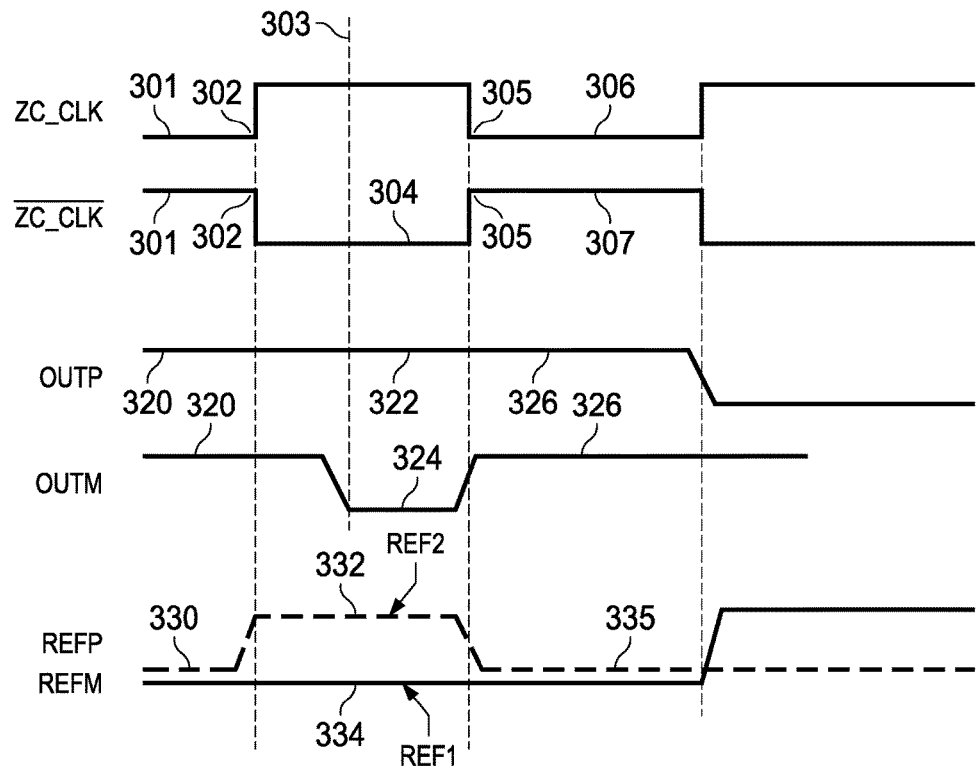
FIG. 3 provides an illustrative timing diagram of the reference voltage control circuit of FIG. 1 in accordance with an embodiment.

The flash ADC 100 described herein addresses either or both of the aforementioned problems. The operation of the reference voltage control circuit 110 of FIG. 2 will now be described in relation to the timing diagram of FIG. 3. The timing diagram of FIG. 3 shows example waveforms of ZC_CLK, $\overline{\text{ZC\_CLK}}$, OUTP, OUTM, REFP, and REFM.

At 301, ZC_CLK is low and $\overline{\text{ZC\_CLK}}$ is high. As noted above, ZC_CLK being low causes the ZC comparator 102 to assert both OUTP and OUTM to logic high levels as shown at 320. As SW1 and SW2 are PMOS devices, both SW1, SW2, SW5, and SW6 will be off while ZC_CLK is low. With $\overline{\text{ZC\_CLK}}$ being high, SW3 and SW4 will both be on thereby switching REFM on to first and second reference nodes 220 and 225 as indicated at 330. At this point, both REF1 and REF2 will be set to the voltage level of REFM.

At 302, ZC_CLK transitions to a logic high level and $\overline{\text{ZC\_CLK}}$ transitions to a logic low level. With ZC_CLK being high, the ZC comparator 102 begins to determine whether Vina is positive or negative, and at 303, OUTP and OUTM are asserted to states based on whether Vina is positive or negative. In the example of FIG. 3, OUTP is shown at a logic high level at 322 and OUTM is shown to transition to a logic low level at 324. With OUTP being high and OUTM being low, SW1 remains off and SW2 turns on. With SW2 now in an on state, REFP is provided to the second reference node 225 and thus, as shown at 332, REF2 becomes approximately equal to REFP. Further, inverter 240 inverts OUTM from a logic low level to a logic high level as $\overline{\text{OUTM}}$. With $\overline{\text{OUTM}}$ being high, SW5 is caused to turn on. At this point, $\overline{\text{ZC\_CLK}}$ is low as illustrated at 304 and thus SW3 and SW4 are off. However, with SW5 being on, REFM continues to be provided to the first reference node 220 and thus REF1 remains at the voltage level of REFM as shown at 334.

At 305, the state of ZC_CLK and $\overline{\text{ZC\_CLK}}$ switch with ZC_CLK being low at 306 and $\overline{\text{ZC\_CLK}}$ being high at 307, a state similar to that shown at 301. OUTP and OUTM are again forced high at 326 by the ZC comparator 102, and REF1 and REF2 are both forced to REFM at 335 as explained above.

Clock edge 305 corresponds to the point at which the flash converter 120 receives the reference voltages REF1 and REF2 (e.g., latches REF1, REF2 or REF1 and REF2 are driven long enough for the flash converter 120 to make its comparison decision) and then begins make its comparison via comparators 122 of Vinb to the various reference voltages generated based on REF1 and REF2. Since REF1 and REF2 have now been received by the flash converter 120 to begin its conversion process, the voltage levels of REF1 and REF2 can be changed at that point without effecting the operation of the flash converter 120. Switches SW3 and SW4 close upon the transition of $\overline{\text{ZC\_CLK}}$ to a logic high thereby forcing both REF1 and REF2 to the voltage level of REFM as explained above. As such, during each cycle of operation of the flash ADC 100, one of the reference voltages REF1 or REF2 is and remains at the voltage level of REFM, while the other of REF1 or REF2 is transitioned from REFM to REFP. As a result, the settling bottleneck problem noted above (and which results from the timing associated with SW5 and SW6) is alleviated as the time delays introduced by the level shifters are no longer in the critical path as the level shifters 250 and 262 shift their voltages upon the occurrence of rising edges of $\overline{\text{ZC\_CLK}}$. The rising edges of $\overline{\text{ZC\_CLK}}$ occurs during a time that is of no consequence to the operation of the flash converter 120. Further, in each cycle REF1 and REF2 are both reset to REFM before one is transitioned to REFP. As a result, the REFP buffer 140 always is loaded with either REF1 or REF2. Similarly, the REFM buffer 142 always is loaded with a fixed load. As such, the problem of signal dependent current taken from the buffers 140, 142 is substantially eliminated.

Figure 4:
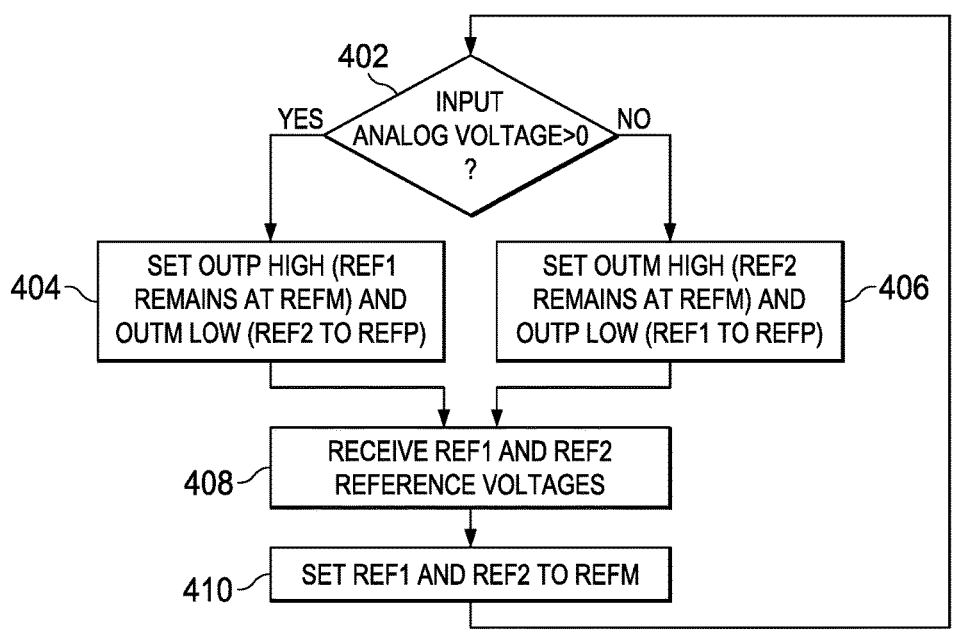
FIG. 4 provides a method for how the reference voltage control circuit of FIG. 1 operates in accordance with an embodiment.

FIG. 4 shows an example of a method of operation of the reference voltage control circuit 110. The operations may be performed in the order shown, or in a different order. Further, the operations may be performed sequentially, or two or more of the operations may be performed concurrently.

At 402, the method includes determining whether the analog input is greater than 0 v. While this operation is being performed, both REF1 and REF2 have been set to REFM. The ZC comparator 102 may be used for this determination. If the input analog voltage is greater than 0 v (positive), then at 404 the method includes setting OUTP to a logic high level (thereby causing REF1 to remain at REFM) and setting OUTM low (thereby causing REF2 to transition from REFM to REFP. However, if the input analog voltage is less than 0 v (negative), then at 406 the method includes setting OUTM to a logic high level (thereby causing REF2 to remain at REFM) and setting OUTP low (thereby causing REF1 to transition from REFM to REFP.

At 408, the REF1 and REF2 reference voltages are received by the flash converter 120 and used to generate the reference voltages for the comparators 122 of the flash converter 120. At 410, while the flash converter 120 is generating its digital output 95, REF1 and REF2 are set to REFM as explained above. Control then loops back to 402 and the process repeats.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . " Also, the term "couple" or "couples" is intended to mean either an indirect or direct wired connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors. The term "approximately" means plus or minus 10%.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A flash analog-to-digital converter (ADC), comprising:
a zero crossing comparator configured to compare an input analog voltage to a zero reference voltage;
a flash converter comprising a plurality of comparators, wherein each of the plurality of comparators receives a comparator reference voltage and wherein each of the plurality of comparators is configured to compare the input analog voltage to each of the plurality of comparators reference voltages respectively; and
a reference voltage control circuit configured to:
responsive to an output signal from the zero crossing comparator, selectively switch a first reference voltage and a second reference voltage to a first reference node and a second reference node of the flash converter; and
switch the second reference voltage to the first reference node and to the second reference node after receipt by the flash converter of an edge of a clock to cause the flash converter to begin using voltages on the first and second reference nodes and the input analog voltage to generate a flash converter output;
wherein the comparator reference voltage for each comparator in the plurality of comparators is generated based on voltages on the first and second reference nodes.

2. The flash ADC of claim 1, wherein the second reference voltage is smaller than the first reference voltage.

3. The flash ADC of claim 1, wherein:
the zero crossing comparator receives a zero crossing clock to initiate the zero crossing comparator to compare the input analog voltage to the zero reference voltage; and
the clock used by the reference voltage control circuit to switch the second reference voltage to the first reference node and to the second reference node comprises an inverse of the zero crossing clock.

4. The flash ADC of claim 3, wherein the output signal from the zero crossing comparator comprises a differential output comprising a first comparator output signal and a second comparator output signal, and wherein the reference voltage control circuit comprises:
a first switch to provide the first reference voltage to the first reference node responsive to the first comparator output signal; and
a second switch to provide the first reference voltage to the second reference node responsive to the second comparator output signal.

5. The flash ADC of claim 3, wherein the output signal from the zero crossing comparator comprises a differential output comprising a first comparator output signal and a second comparator output signal, and wherein the reference voltage control circuit comprises:
a first switch to provide the first reference voltage to the first reference node responsive to the first comparator output signal;
a second switch to provide the first reference voltage to the second reference node responsive to the second comparator output signal; and
a third switch to provide the second reference voltage to the first reference node responsive to the inverse of the zero crossing clock; and
a fourth switch to provide the second reference voltage to the second reference node responsive to the inverse of the zero crossing clock.

6. The flash ADC of claim 5, further comprising:
a first inverter to invert the second comparator output signal to produce an inverted second comparator output signal;
a second inverter to invert the first comparator output signal to produce an inverted first comparator output signal;
a fifth switch to provide the second reference voltage to the first reference node responsive to the inverted second comparator output signal; and
a sixth switch to provide the second reference voltage to the second reference node responsive to the inverted first comparator output signal.

7. The flash ADC of claim 5, wherein:
the first and second switches comprise one of n-type metal oxide semiconductor field effect transistor (NMOS) and p-type metal oxide semiconductor field effect transistor (PMOS) devices; and
the third and fourth switches comprise the other one of NMOS and PMOS devices.

8. The flash ADC of claim 1, wherein the zero reference voltage is ground with respect to the input analog voltage.

* * * * *